US008966765B2

(12) United States Patent (10) Patent No.: US 8,966,765 B2
White et al. (45) Date of Patent: Mar. 3, 2015

(54) MEDICAL BOOM WITH ARTICULATED ARMS AND A BASE WITH PRECONFIGURED REMOVABLE MODULAR RACKS USED FOR STORING ELECTRONIC AND UTILITY EQUIPMENT

(75) Inventors: Paul White, Lake Oswego, OR (US); Larry Vollum, Portland, OR (US); Dennis Palatov, Portland, OR (US)

(73) Assignee: CompView Medical, LLC, Beaverton, OR (US)

( * ) Notice: Subject to any disclaimer, the term of this patent is extended or adjusted under 35 U.S.C. 154(b) by 0 days.

(21) Appl. No.: 12/655,023

(22) Filed: Dec. 21, 2009

(65) Prior Publication Data

US 2010/0115750 A1 May 13, 2010

Related U.S. Application Data

(60) Division of application No. 11/686,090, filed on Mar. 14, 2007, now Pat. No. 7,644,898, which is a continuation-in-part of application No. 11/093,075, filed on Mar. 28, 2005, now Pat. No. 7,516,924.

(60) Provisional application No. 60/785,052, filed on Mar. 22, 2006.

(51) Int. Cl.
*E06B 9/15* (2006.01)
*G01R 31/12* (2006.01)

(52) U.S. Cl.
CPC .................................. *G01R 31/1272* (2013.01)
USPC .............................. 29/897.3; 29/430; 312/209

(58) Field of Classification Search
USPC ............ 29/897.3, 897.32, 897.312, 428, 429, 29/430; 312/209, 280
See application file for complete search history.

(56) References Cited

U.S. PATENT DOCUMENTS

| 3,660,591 | A | * | 5/1972 | Schultz et al. | ............... | 174/70 R |
| 4,288,132 | A | * | 9/1981 | Znamirowski et al. | ..... | 312/265.5 |
| 4,632,473 | A | * | 12/1986 | Smith | ......................... | 312/265.1 |
| 5,351,676 | A | * | 10/1994 | Putman | ........................ | 600/117 |
| 5,878,536 | A | * | 3/1999 | Demmitt et al. | ............... | 52/36.4 |
| 2004/0035987 | A1 | * | 2/2004 | Oddsen, Jr. | .................. | 248/121 |

* cited by examiner

*Primary Examiner* — Christopher Besler
(74) *Attorney, Agent, or Firm* — Klarquist Sparkman, LLP (57) ABSTRACT

The present invention is directed to a medical boom with articulated arms and a base cabinet designed to accommodate modular equipment and utility racks that include video processing, computer, and electronic, and other utility equipment that can be easy inserted and removed from the base cabinet, as well as a method of manufacturing and using the same. The boom includes a stationary base that is configured to be installed into an operating room and one or more boom arms supported by the stationary base and configured to extend over an operating table in the operating room. The structural base includes one or more bays configured to receive a modular rack of electrical equipment. In various embodiments, the structural base cabinet further incorporates wiring to connect the equipment installed in the modular racks to video monitors and other equipment mounted on the articulated booms. The modular racks are preconfigured with a variety of electronic equipment such as computers, video processors and the like. The modular racks are installed in the base cabinet subsequent to the cabinet's structural installation in the operating room and may be readily removed or replaced at a later time.

9 Claims, 11 Drawing Sheets

MEDICAL BOOM WITH ARTICULATED ARMS AND A BASE WITH PRECONFIGURED REMOVABLE MODULAR RACKS USED FOR STORING ELECTRONIC AND UTILITY EQUIPMENT

RELATED APPLICATIONS

This application is a divisional of and claims the benefit of priority to Non-provisional U.S. application Ser. No. 11/686,090, filed Mar. 14, 2007, now U.S. Pat. No. 7,952,360; which in turn claims the benefit of priority to U.S. Provisional Patent Application No. 60/785,052, filed Mar. 22, 2006, the entire contents of each of which are incorporated herein by this reference. This application further claims the benefit of priority to Non-provisional U.S. application Ser. No. 11/093,075, filed Mar. 28, 2005, now U.S. Pat. No. 7,516,924 B2 of which 11/686,090 is a Continuation-in-Part, the entire contents of each of which are incorporated herein by this reference. All related applications are assigned in common to the assignee of the present divisional application.

FIELD OF THE INVENTION

The present invention relates to a medical boom with one or more articulated arms used to suspend video displays for use in a hospital operating room, and more particularly, to a medical boom having a base cabinet designed to accommodate modular equipment racks and utility cabinets which enable the easy insertion and removal of video processing, computer, electronic and other equipment into or out of the base cabinet.

BACKGROUND OF THE INVENTION

State of the art hospital operating rooms now contain a wide variety of audio, visual and technology tools, such as video cameras, video recorders, microphones and voice recorders, video guided ultrasound imaging systems, lasers, cytoscanners, etc. With delicate surgery for example, a 3D video camera may be placed in or above the surgical area of the patient. The image from the camera is then transmitted to a large display, such as a flat panel, allowing the operating doctor and medical staff to see an enlarged visual of the surgical area. The enlarged image makes it easier for the doctor to perform the surgery compared to relying on the naked eye.

U.S. application Ser. No. 11/093,075, entitled "ARTICULATED BOOM FOR SUPPORTING VIDEO AND MEDICAL EQUIPMENT IN HOSPITAL OPERATING ROOMS", incorporated herein for all purposes, and assigned to the same assignee of the present application, describes a medical boom used for suspending video and other equipment in a hospital operating room. The medical boom disclosed in the above-mentioned application features articulated arms attached to a structural equipment cabinet that is mounted to the floor or wall of the operating room. Electronic equipment is installed or mounted directly in the cabinet at the factory prior to shipment to customer facility such as a hospital operating room. While the aforementioned medical boom does dramatically lower installation time and cost compared to previously known approaches in the prior art, the requirement of installing electronic equipment in the structural cabinet of the medical boom in the factory, as opposed to on site, is less than ideal. Due to size and weight of the cabinet, the medical boom is typically transported by truck. The cabinet and pre-installed equipment are therefore subject to vibration, shock and adverse temperatures and humidity conditions during transit, all of which could potentially damage the electronic equipment. Alternatively, if the electronic equipment is shipped separately, it has to be installed and configured on site, requiring a team of technicians to travel to the customer facility, adding to the time and expense of the installation.

A medical boom with articulated arms and a base cabinet designed to accommodate modular equipment and utility racks that include video processing, computer, and electronic, and other utility equipment that can be easy inserted and removed from the base cabinet is therefore needed.

SUMMARY OF THE INVENTION

A medical boom with articulated arms and a base cabinet designed to accommodate modular equipment and utility racks that include video processing, computer, and electronic, and other utility equipment that can be easy inserted and removed from the base cabinet is disclosed. The boom includes a stationary base that is configured to be installed into an operating room and one or more boom arms supported by the stationary base and configured to extend over an operating table in the operating room. The structural base includes one or more bays configured to receive a modular rack of electrical equipment. In various embodiments, the structural base cabinet further incorporates wiring to connect the equipment installed in the modular racks to video monitors and other equipment mounted on the articulated booms. The modular racks are preconfigured with a variety of electronic equipment such as computers, video processors and the like. The modular racks are installed in the base cabinet subsequent to the cabinet's structural installation in the operating room and may be readily removed or replaced at a later time. The placement of equipment into preconfigured modular racks allows such equipment to be transported and handled separately from the structural base cabinet while allowing it to be preconfigured as a system. This prevents damage to sensitive equipment during transport and facilitates rapid maintenance and upgrades of the equipment after it is placed in service.

BRIEF DESCRIPTION OF THE DRAWINGS

The invention, together with further advantages thereof, may best be understood by reference to the following description taken in conjunction with the accompanying drawings in which.

It should be noted that like reference numbers refer to like elements in the figures.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so as not to unnecessarily obscure the present invention.

Figure 1:
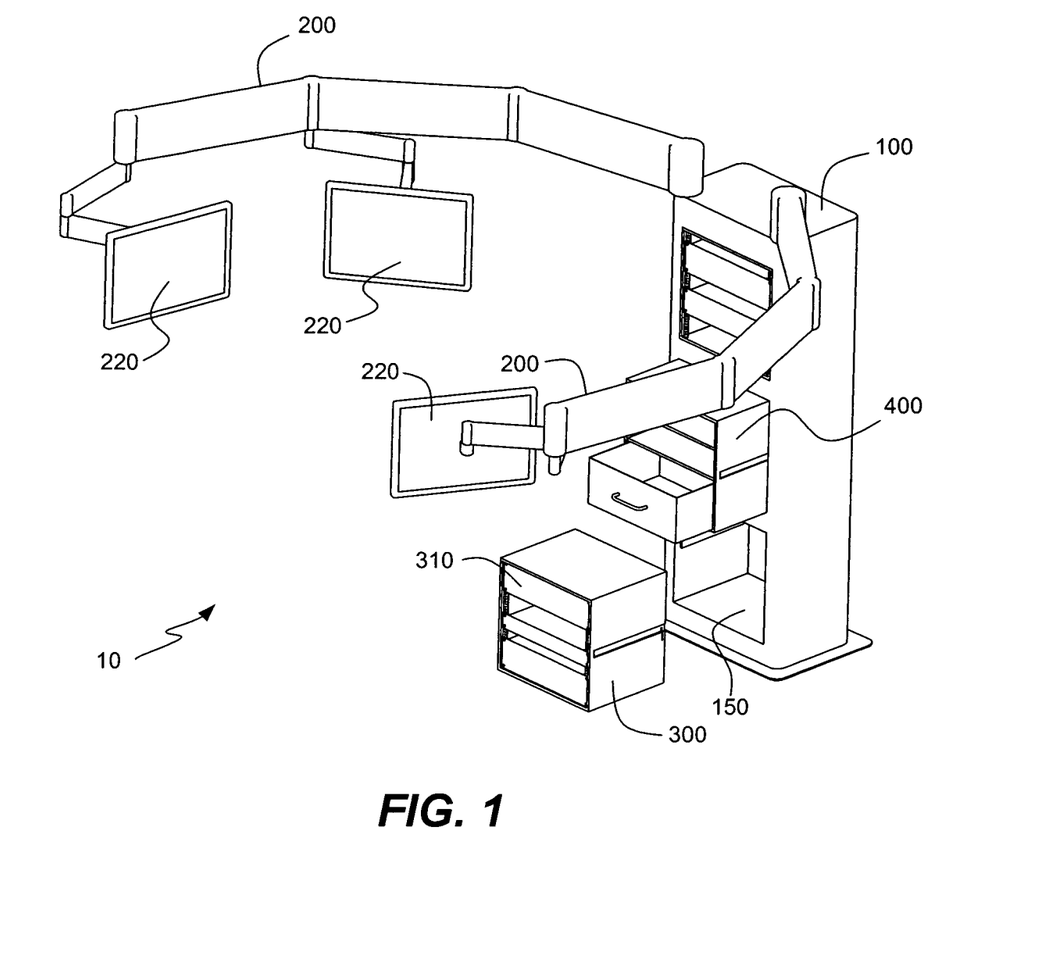
FIG. 1 illustrates medical boom with articulated arms and a base cabinet designed to accommodate modular equipment racks according to the present invention.

Referring to FIG. 1, a medical boom with articulated arms and a base cabinet designed to accommodate modular equipment racks according to the present invention is shown. The medical boom 10 includes a base cabinet 100, one or more articulated arms 200, and a plurality of video displays 220 suspended from the articulated arms 200. The base cabinet 100 includes a number of equipment bays 150. The equipment bays 150 are used for accommodating either equipment racks 300 and/or utility modules 400. For more details on the design of the base cabinet 100 and articulated arms 200 of the medical boom 10, see the aforementioned pending U.S. application Ser. No. 11/093,075, incorporated by reference herein for all purposes.

Figure 2A:
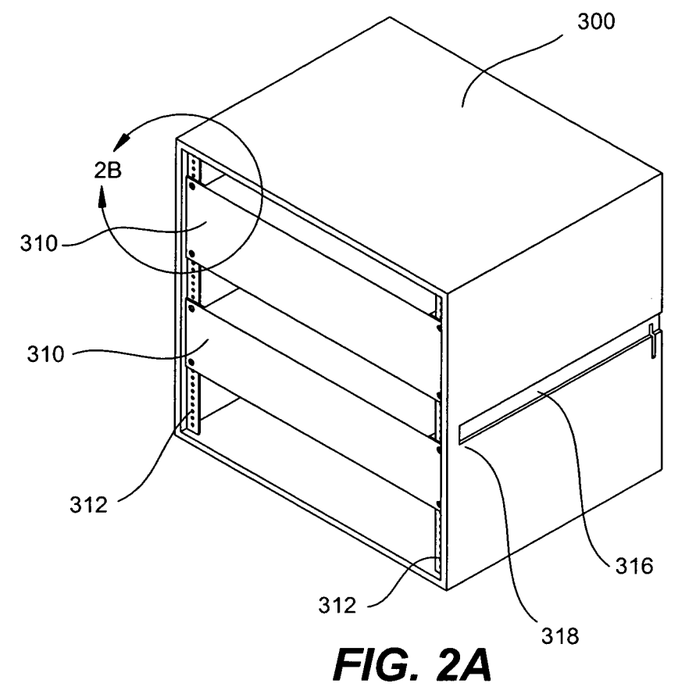
FIGS. 2A and 2B illustrate a modular equipment rack for use with the base cabinet of the medical boom of the present invention.
Figure 2B:
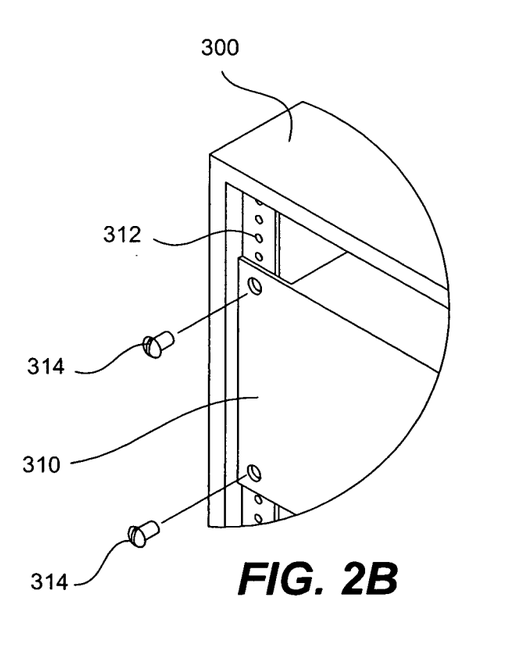

Referring to FIGS. 2A and 2B, a modular equipment rack 300 for use with the base cabinet 100 of the medical boom 10 according to one embodiment is shown. The equipment rack 300 is a rectangular shaped box or cabinet configured to house electronic equipment 310. The front face of the rack 300 includes a pair of mounting brackets 312, each with a plurality of threaded holes. As illustrated in FIG. 2B, screws are used to screw or mount the equipment 310 into the mounting brackets 312 of rack 300. As illustrated in the two figures, one or more pieces of electronic equipment 310 can be housed in the rack 300. The equipment rack 300 also includes a pair of guides 316 and stops 318 located on opposite sides of the cabinet (in the FIG. 2A, only one groove 316 and stop 318 are visible). The guides 316 are used to install the rack 300 into the equipment bays 150 of the base cabinet 100, as described in more detail below.

Figure 3:
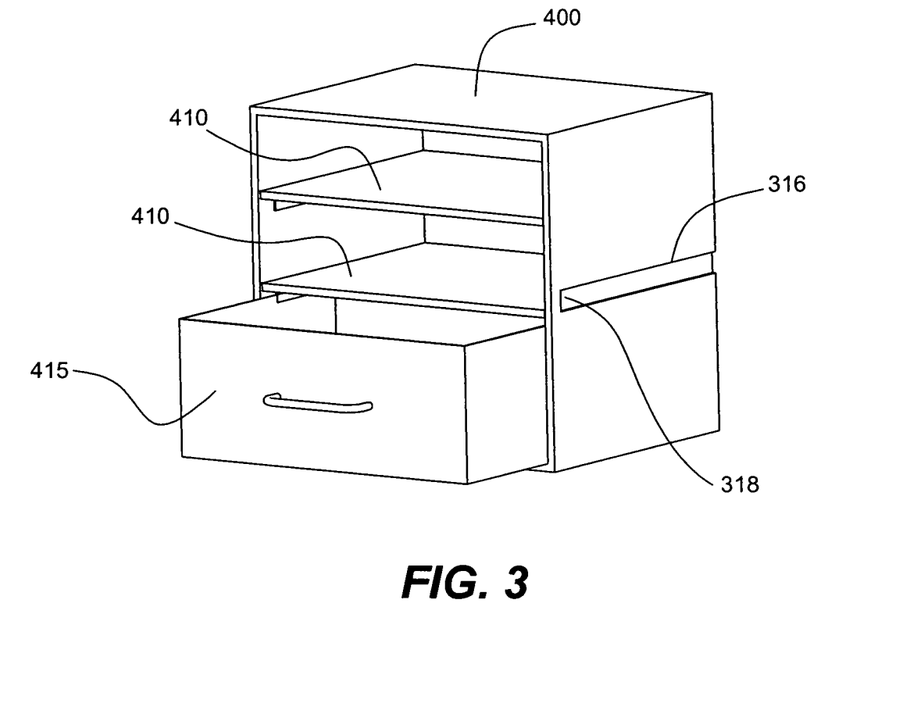
FIG. 3 illustrates a utility module that may be installed in the base cabinet of the medical boom in lieu of a modular equipment rack according to the present invention.

Referring to FIG. 3, a utility module 400 that may be installed in the base cabinet 10 of the medical boom 10 in lieu of a modular equipment rack 300 according to the present invention is shown. The utility module 400 is also a rectangular shaped box or cabinet configured to store utility medical equipment, such as surgical tools and the like. The utility module 400 includes one or more shelves 410 and one or more drawers 415. The utility module also includes a pair of guides 316 and stops 318 also located on opposite sides of the cabinet (only one guide 316 and stop 318 are visible in the figure). The guide rails 316 are used to install the utility module 400 into the equipment bays 150 of the base cabinet 100, as described in more detail below. It should be noted that utility module 400 does not necessarily require a combination of shelves 410 and drawers 415. In alternative embodiments, the modules 400 may include just one or more shelves 410 or just one or more drawers 415.

In accordance with one embodiment, the equipment racks 300 and the utility modules 400 are the same size and are inter-changeable. Each can be inserted into any one of the equipment bays 150 of the base cabinet 100 to configure the medical boom 10 in any manner desired. It should be noted, however, that the racks 300 and modules 400 do not necessarily have to be the same size. The bays 150 in the base cabinet 100 can be made of any size and the racks and/or modules 400 can be made the appropriate size to fit into the bays 150.

Figure 4A:
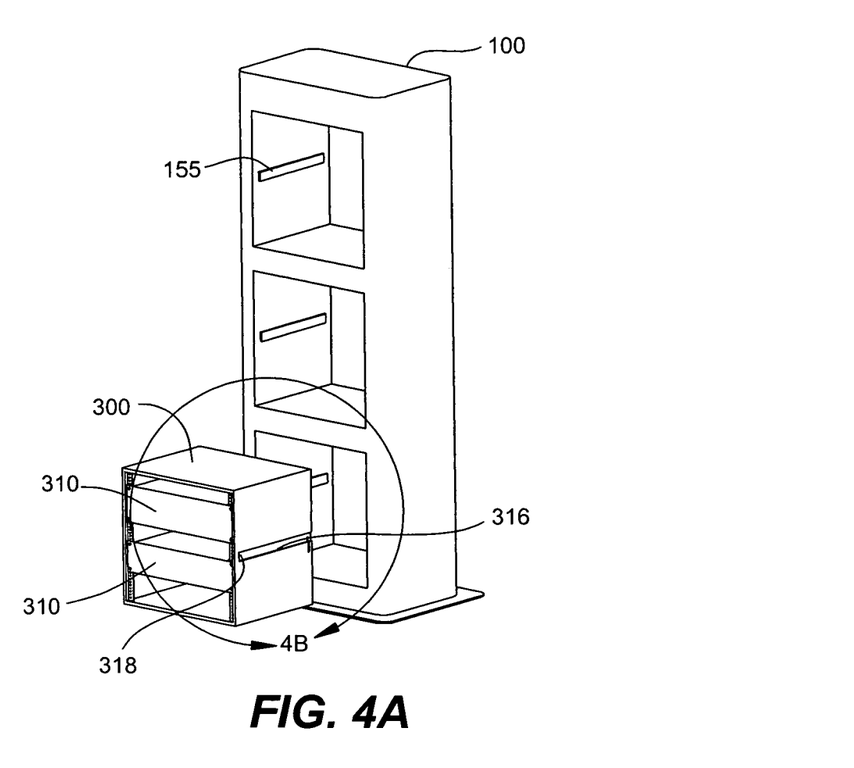
FIGS. 4A-4B illustrate two drawings showing the installation of a modular electronic equipment rack in the base cabinet of the present invention.
Figure 4B:
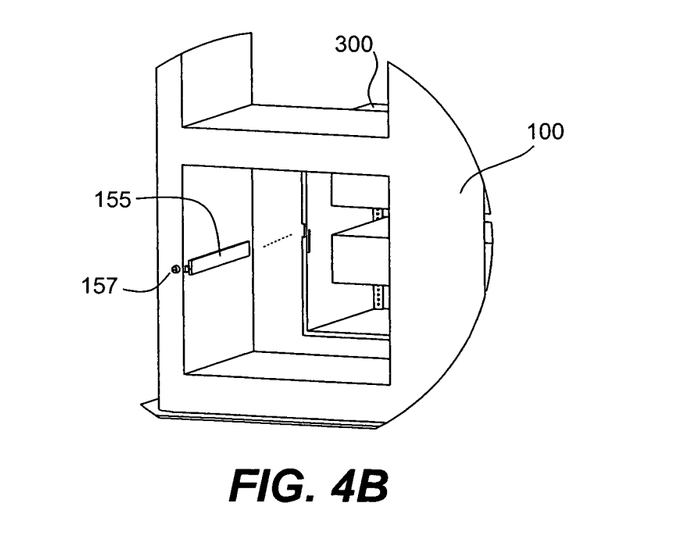

Referring to FIGS. 4A and 4B, the installation of a modular equipment rack 300 in the base cabinet 100 of the present invention is illustrated. In FIG. 4A, an equipment rack 300 is shown being positioned for installation into a bay 150 of the base cabinet 100. In FIG. 4B, a pair of guide rails 155, provided within each bay 150, are shown (only one guide rail 155 is visible). The two guides 316 on the opposite sides of either the rack 300 and/or utility module 400 are configured to engage and move along the two guide rails 155 provided in each bay 150. The stops 318, located at the end of each of the guides 316, prevent the rack 300 or utility module 400 from sliding through the back of the base cabinet 100. A lock 157 is provided within the structure of the base cabinet 100 to lock either the rack 300 or utility module 400 in place once installed in the bay 150.

Figure 5:
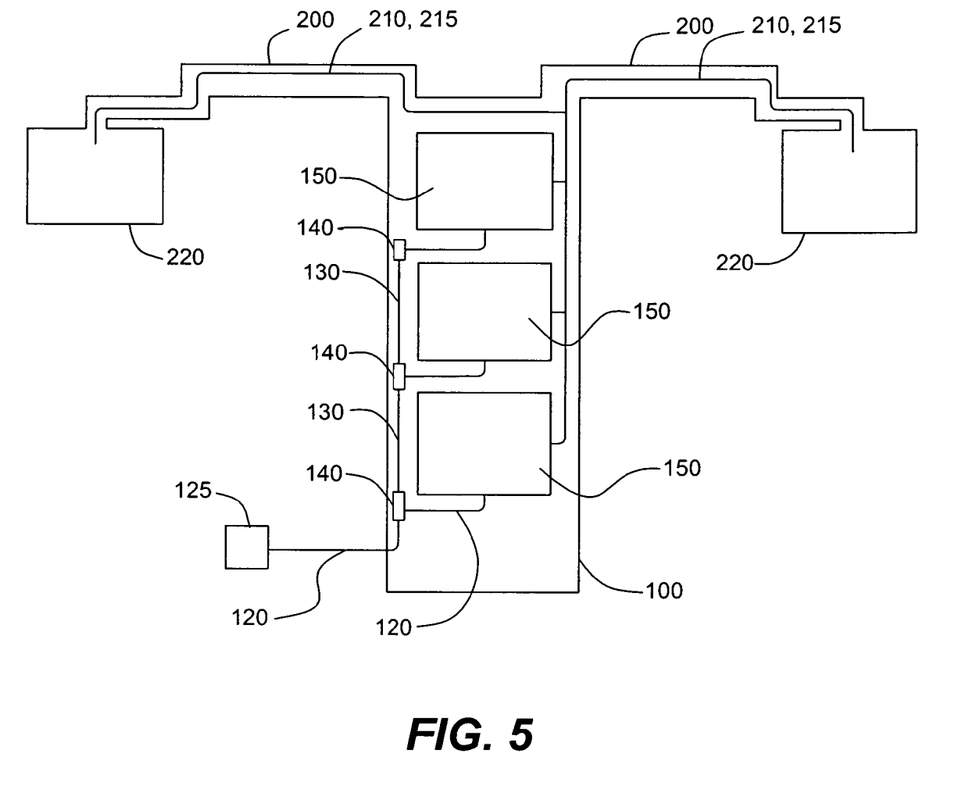
FIG. 5 is a cross section diagram illustrating an exemplary routing for the electrical cabling used for the video display and electronics housed in the medical boom of the present invention.

FIG. 5 is a cross section diagram illustrating an exemplary routing for the electrical cabling used for the video display and electronics housed in the medical boom 10 of the present invention. The cross section shows the routing of video 210 and power cabling 215 between the video displays 220 suspended by the articulated arms 200 connected to the bays 150 in the base cabinet 10. The cross section also shows electrical wiring 120, conduit 130, and junction boxes 140 between a power supply 125 and the bays 150. The aforementioned electrical wiring 120, conduit 130, and junction boxes 140 are pre-installed in the base cabinet 100 prior to shipment to a customer facility. During installation of the racks 300 and/or modules 400 at the customer facility (an operating room or other medical facility), the video 210 and power cabling 215 are connected along with electrical wiring 120 and conduit wiring 130 to the equipment in the bays 150.

The medical boom 10 of the present invention thus provides a flexible, self-contained medical video presentation unit that can be quickly and easily installed in an existing operating room. With the bays 150 in the base cabinet, electrical equipment in the equipment racks 300 and other utilities in the utility modules 400 can readily be installed on site in the hospital operating room. In the event the electronic equipment needs to be serviced or repaired, the racks 300 can be readily be removed and the equipment repaired or replaced, with minimum down time.

In the one embodiment, a structural cabinet 100 is shipped to the customer facility along with articulated boom arms 200. One or more equipment racks 300 and/or utility modules 400 are then configured with electronic equipment 310 and other utility equipment according to customer requirements at a location remote from the customer. After configuration and testing, the racks 300 of equipment 310 and/or modules 400 are then separately shipped to the customer facility, either simultaneously or at a different time as the cabinet 100. The required video monitors 220 can be either shipped together with either the racks 300, the boom 10, or separately.

At the customer facility, the base cabinet 100 is first structurally attached to the facility floor in the desired location. The base cabinet is affixed to the floor or wall of the operating room using any one of a number of known elements such as concrete anchors, bolts, studs, structural adhesives or a combination thereof. Upon completion of the structural installation, the installation of the necessary electrical power or signal cabling is carried out to connect the electrical wiring and conduit in the base cabinet 100. Next, the articulated boom arms 200 are mounted to the base cabinet 100 and the video monitors 220 are attached to the booms 200. To complete the installation of the present invention, one or more of the preconfigured equipment racks 300 are installed into the equipment bays 150 of the base cabinet 100. One or more of the equipment bays 150 may also receive a utility module 400. As a final step, electrical connections are made to the installed electrical equipment 310 and then the entire system is powered up and tested.

In an alternative embodiment, one or more equipment bays may be configured with protective covers or user-accessible doors to protect the electronic equipment contained therein and to optionally limit user access thereto.

Should service or configuration changes be required after the system of the present invention is placed in service, one or more of the equipment racks 300 can be readily removed, serviced, or replaced with another preconfigured equipment rack. The complete racks 300 can be easily shipped to the factory for service or configuration. A replacement preconfigured rack 300 can be shipped to the customer facility in advance and quickly exchanged in the field with any troubleshooting and configuration being performed offline, resulting in the minimum possible downtime and cost.

Figure 6A:
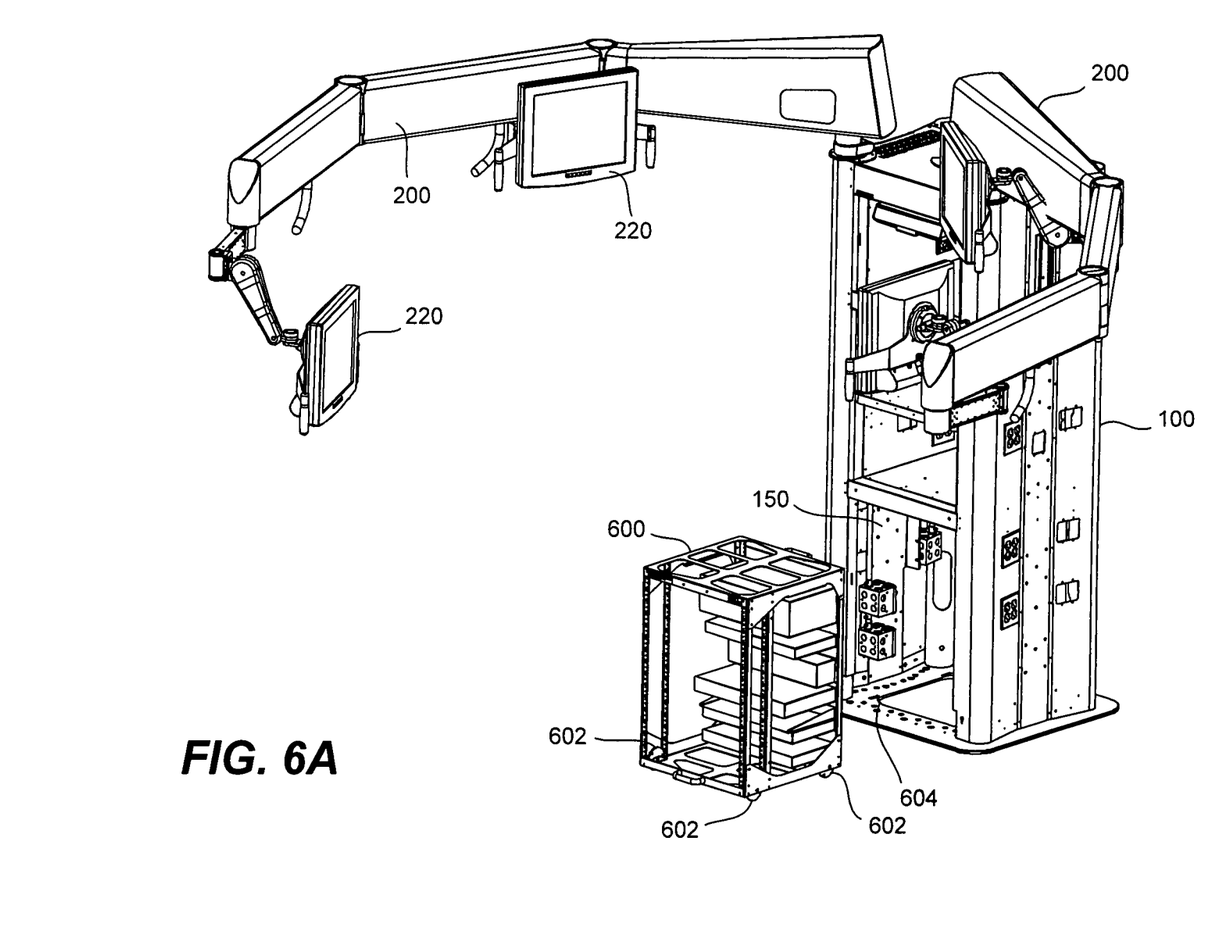
FIGS. 6A-6C illustrate an alternative embodiment of the modular equipment rack in accordance with another embodiment of the invention.
Figure 6B:
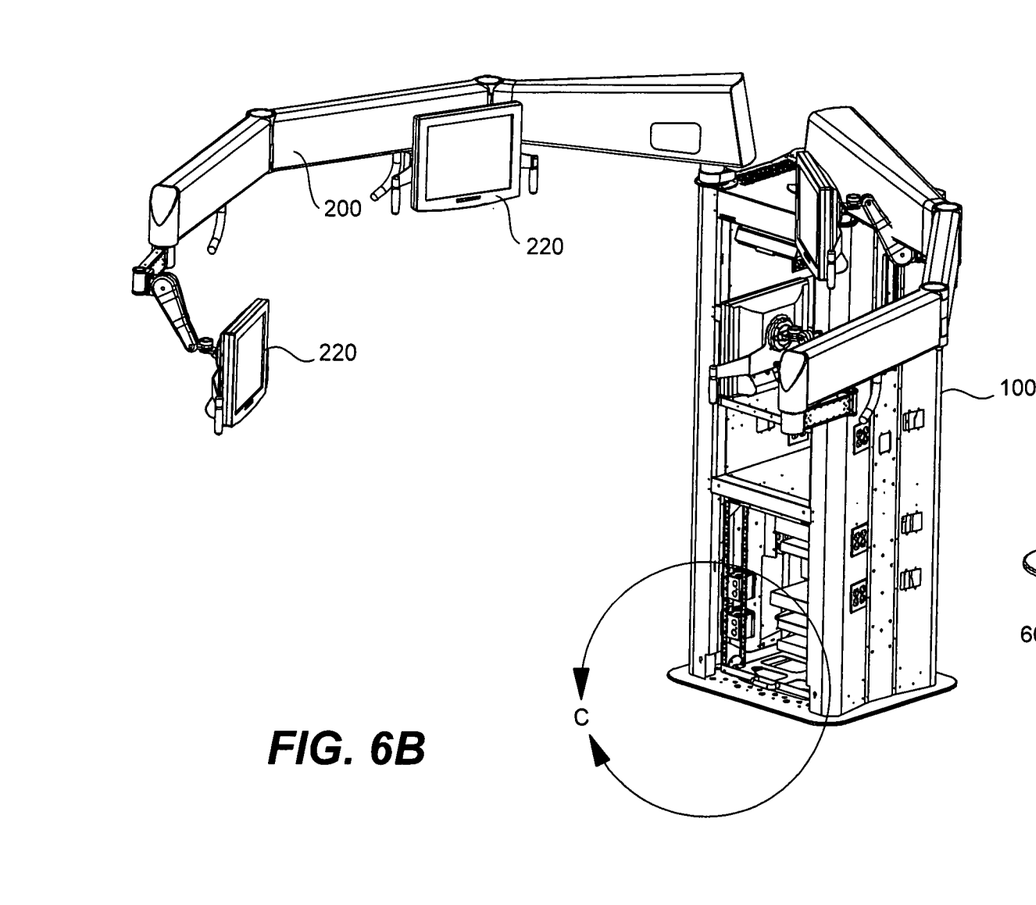
Figure 6C:
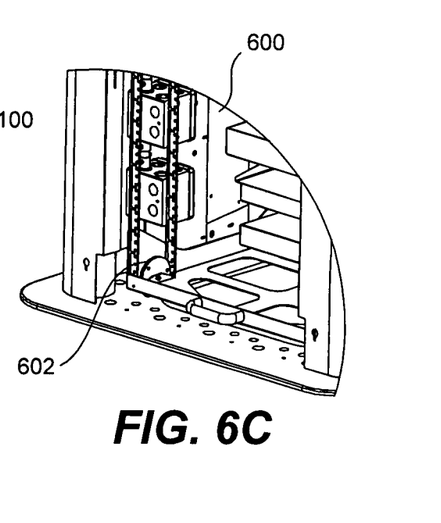

Referring to FIGS. 6A-6C, an alternative embodiment of the modular equipment rack is shown. In this embodiment, the equipment rack 600 includes a plurality of trolley wheels 602, each located at the bottom four corners of the rack 600. The trolley wheels 602 are designed to allow the equipment rack 600 to be readily rolled around. The trolley wheels 602 also facilitate in the installation of the rack 600 into the bays 150 of the base cabinet 100 of the boom 10. A plurality of slots 604 are provided in the bay 150 in the bottom of the base cabinet 100, as best illustrated in FIG. 6A. Although not clearly illustrated in the figure, the slots 604 are provided to accommodate the trolley wheels 602 of the rack 600. During installation, the rack 600 is rolled into the equipment bay 150 until the trolley wheel 602 drop into the slots 604 of the cabinet 100. With the trolley wheels 602 in the slots 604, the rack 600 is "locked" into place within the boom 10. To remove the rack 600, a firm pull on the rack is required to pull the trolley wheels 602 out of the slots 604. The rack 600 can thereafter be rolled out of the equipment bay and readily accessed for repairs or upgrades. FIG. 6B shows the rack 600 inside the bay 150. FIG. 6C shows an exploded view of one of the wheels 602 of the rack 600 dropped into place within a slot 604 of the base cabinet 100.

Figure 7:
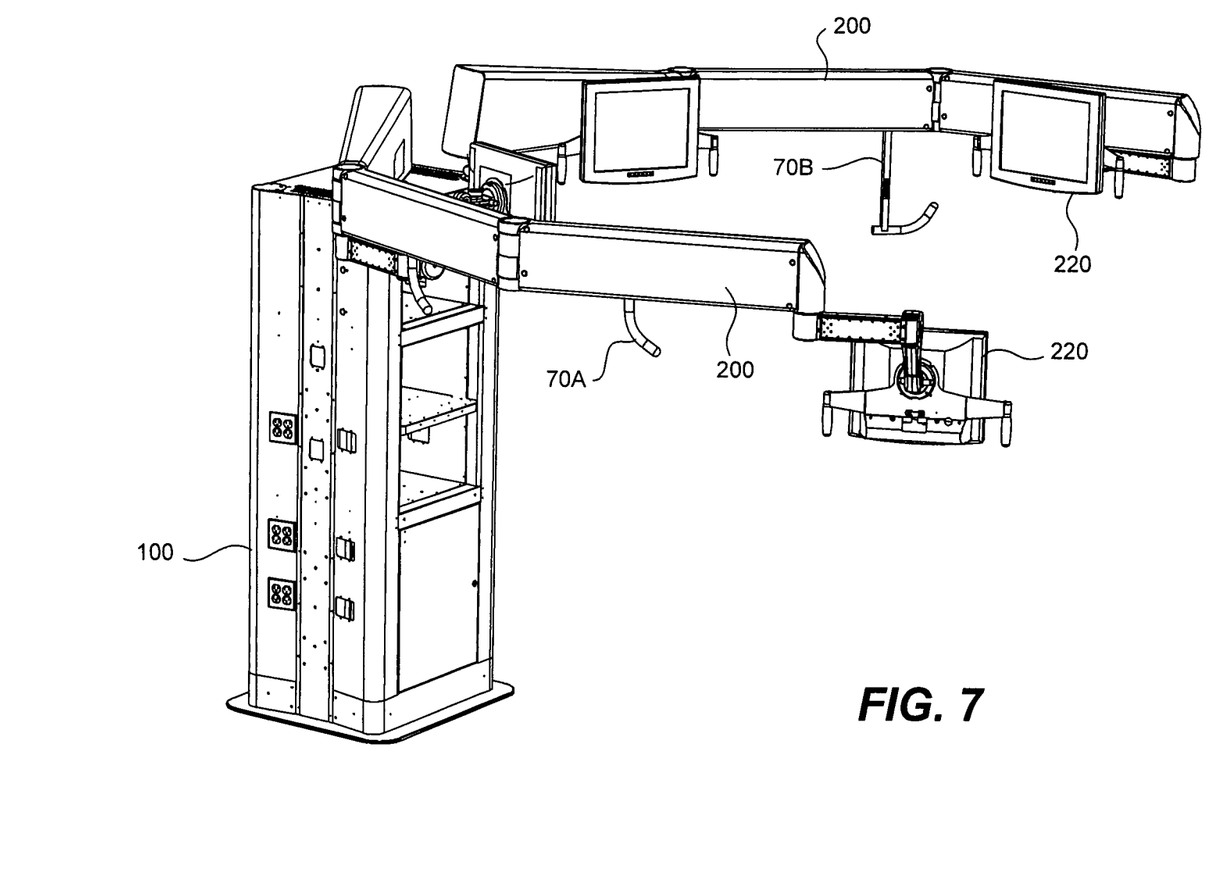
FIG. 7 illustrates retractable arms on the articulated arms of the medical boom in accordance with another embodiment of the invention.

Referring to FIG. 7, the articulated arms 200 with retractable handles 70 are shown in accordance with another embodiment of the invention. One or more handles 70 are provided on each articulated arm 200 for the purpose of facilitating the movement of the video displays 220 and other supported equipment into position. For the sake of illustration, a first handle 70A is shown in a retracted position, while handle 70B is shown in the non-retracted position. When the handle 70 is not in use, it may be partially housed within the articulated arm 220. When the arm 200 is to be positioned, the exposed portion of the handle is pulled down into the non-retracted position. The handle 70 is then used to move the articulated arm 200 so the display monitors 220 are positioned to a desired location. The handle 70 provides a higher degree of leverage, making it easier to move the articulated arm 200 so the display monitors 220 are positioned to a desired location. The handle 70 provides a higher degree of leverage, making it easier to move the articulated arms 200 into a desired position. It also makes it easier for members of the medical staff in the operating room who are not very tall to be able to move or manipulate the position of the arms 200 and display monitors 220.

Figure 8A:
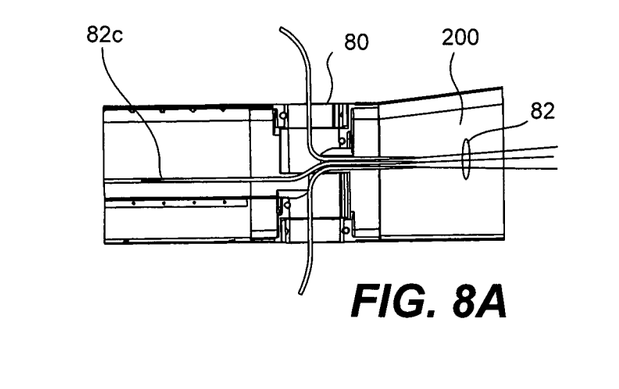
FIGS. 8A-8B illustrate the routing of power and signal wires through the segments and joints of the articulated arm of the medical boom in accordance with the present invention.
Figure 8B:
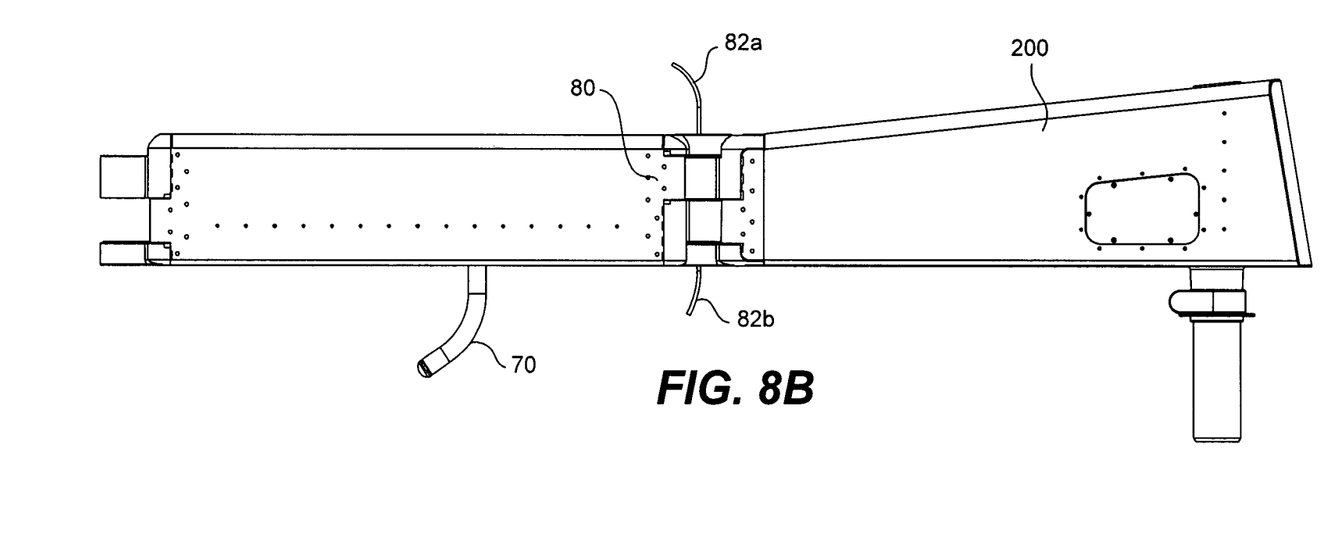

FIGS. 8A-8B illustrate yet another feature of the articulated arms 200 of the present invention. With this embodiment, the articulated arms 200 include a plurality of segments joined together by joints 80. The segments include recesses that allow for the routing of wires 82, for example power and signal cabling for the displays 220. As best illustrated in the cross section diagram of FIG. 8A, the joints 80 are capable of distributing the wires in multiple directions, including through the top and bottom of the joint and forward to the next segment of the articulated arm 200. FIG. 8B shows two wires 82a and 82b protruding out from the top and bottom directions of the joint 80, allowing equipment to be attached to both the top and bottom of the arms 200. For example, appendage arms and/or displays 220 can be suspended off the bottom of an arm 200, while task lighting or other equipment can be attached to the top of the arm 200. For more details of the segments and the joints 80 of the arm 200, see the above-identified application U.S. Ser. No. 11/093,075.

Figure 9A:
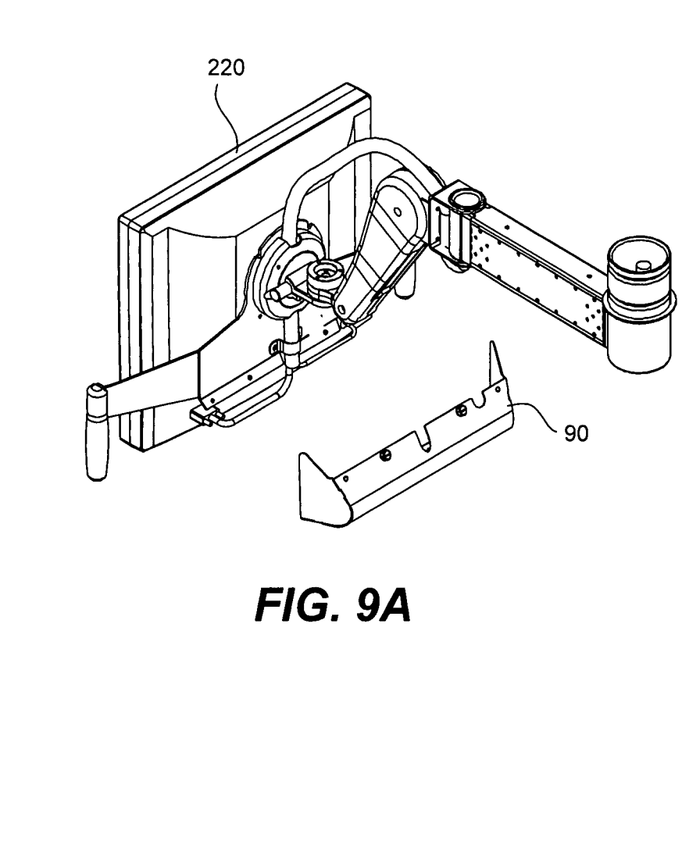
FIGS. 9A-9B illustrate a cowling plate used for covering the power and signal wires plugged into the back of the displays of the medical boom in accordance with the present invention.
Figure 9B:
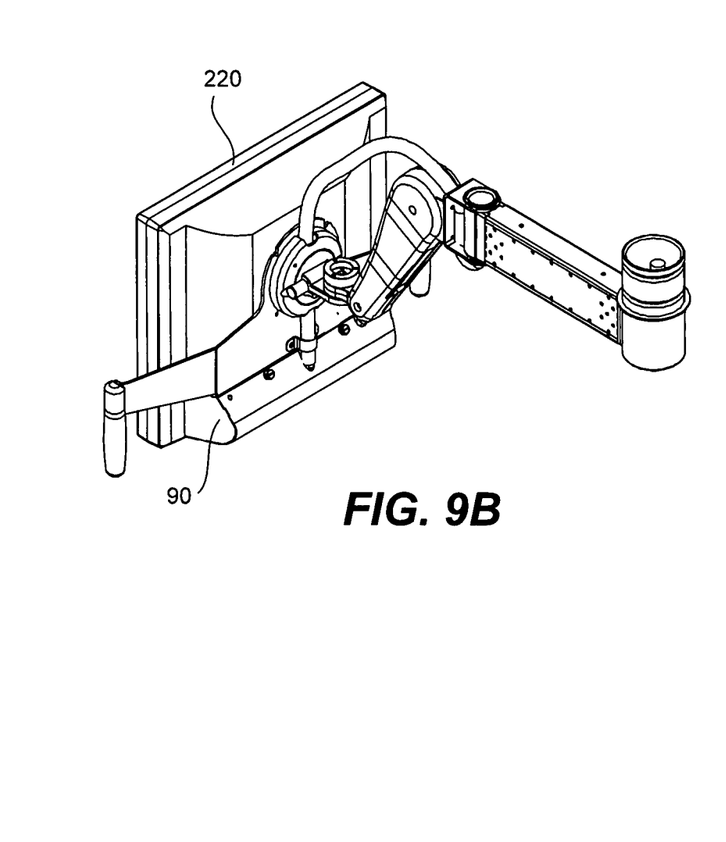

FIGS. 9A and 9B illustrate a cowling plate 90 used for covering the power and signal wires plugged into the back of the displays 220. In FIG. 9A, the cowling 90 is illustrated removed from the back of the display 220. In FIG. 9B, the cowling 90 is attached to the back of the display 220, covering the wires. In various embodiments, the cowling 90 can be made from a metal, plastic or any other hard or soft material. It also protects the wires from contaminants and prevents the wires from being inadvertently pulled or removed from the displays 220, and is more aesthetically pleasing to look at.

Figure 10:
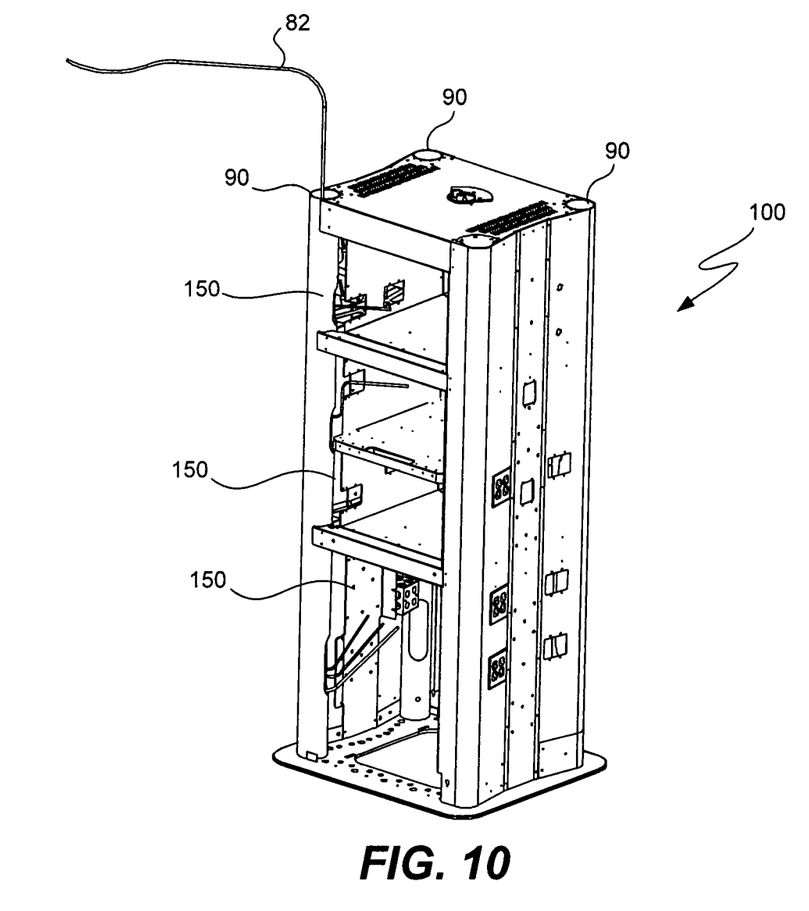
FIG. 10 illustrates the symmetrical features of the base cabinet of the medical boom according to the present invention.

Referring to FIG. 10, the symmetrical nature of the base cabinet 100 is shown. The cabinet 100 is symmetrical for a number of reasons. The articulated arms 200 (not illustrated) can be attached to any one of the four recesses 94 located in the four corners of the top of the cabinet 100. For the sake of illustration, a wire 82 is shown passing through one of the recesses 90. If an articulated arm 200 were attached, the wire would be routed through the arm 200 and joints 18 as described above. Within the base cabinet 100, the wire 82 would be connected to electrical equipment, power transformers, a power supply, etc. The equipment racks 300 and 600 can also be inserted into the equipment bays 150 from either the side of the cabinet 100, either as shown in the diagram or in the opposing side of the diagram. In this regard, the medical boom 10 does not have a "front" or "back". On the contrary, the cabinet 100 is symmetrical, allowing the front panel or the equipment contained in the racks 300 and 600 to be exposed through either side of the medical boom, depending on how it was installed. The symmetrical design of the medical boom 10 increases flexibility and allows the base cabinet 100 to be installed into virtually all operating room environments.

While this invention has been described in terms of several embodiments, there are alteration, permutations, and equivalents, which fall within the scope of this invention. For example, the stationary base does not necessarily have to be fastened to the floor of an operating room. It can also be attached to or affixed to the wall of an operating room. Further, while the present invention has been described as a medical boom for use in a hospital operating room, it does not necessarily have to be limited to this environment. Rather the boom of the present invention may be used in a dentist office, examination rooms, veterinary clinics, surgical suites, etc. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A method, comprising:
fabricating a structural cabinet of a medical boom, the structural cabinet being configured to support one or more elongate, articulated boom arms, the structural cabinet including one or more bays configured to receive therein one or more racks configured to house electrical equipment;
fabricating the one or more articulated boom arms, each articulated boom arm being configured to be supported by the structural cabinet and having at least two articulated joints and three arm segments that permit the boom arms to extend away from the structural cabinet;
fabricating the one or more racks configured to house electrical equipment and to be installed in the more or more bays of the structural cabinet;
shipping the structural cabinet and the articulated boom arms of the medical boom to a customer facility without the racks being received within the more or more bays of the structural cabinet;
installing the one or more racks into the one or more bays prior to shipment to the customer facility;
installing, configuring and testing the electrical equipment within the one or more racks prior to shipment to the customer facility;
installing one or more video monitors coupled to an articulated member extending from the one or more articulated boom arms;
removing the one or more racks containing the configured and tested electrical equipment from the one or more boys after the installing, configuring and testing of the electrical equipment; separately shipping the one or more racks housing the installed, configured and tested electrical equipment to the customer facility after the installing, configuring, testing and removing thereof from the one or more bays;
installing the electrical equipment within the one or more racks;
installing the structural cabinet in the customer's facility;
attaching the articulated boom arms to the structural cabinet;
installing the one or more racks housing the installed, configured and tested electrical equipment into the one or more bays of the structural cabinet at the customer facility after installing the structural cabinet, and
suspending the one or more video displays from the articulated boom arms.

2. The method of claim 1, further comprising providing electrical power to the electrical equipment housed within the one or more racks installed in the one or more bays in the structural cabinet of the medical boom.

3. The method of claim 1, further comprising providing video signals from the electrical equipment housed within the one or more racks installed in the one or more bays through electrical wires provided in the structural cabinet and routed through the articulated boom arms to the one or more video monitors.

4. The method of claim 1, further comprising periodically removing the installed one or more racks to repair, service, upgrade or replace the electrical equipment housed within the removed rack.

5. The method of claim 1, further comprising preconfiguring the one or more racks to a particular customer's order.

6. The method of claim 5, further comprising replacing an originally preconfigured one or more racks with a differently preconfigured one or more racks within the structural cabinet installed in the customer's facility.

7. The method of claim 1 wherein the fabricating of at least one of the articulated boom arms is performed in such manner that the boom arm is configured to include plural boom arm segments that articulate around a boom arm joint, the method further comprising routing electrical wires through recesses formed within the plural boom arm segments during fabrication of the at least one articulated boom arm, the electrical wires configured to operatively couple electrical equipment housed within the one or more racks with one or more video displays suspended from the at least one articulated boom arm.

8. The method of claim 7, wherein the boom arm joint has a top and bottom, and the boom arm joint is configured to distribute the electrical wires in multiple directions including the top and bottom of the joint and forward to the next one of the plural boom arm segments.

9. The method of claim 1, wherein the fabricating of the structural cabinet is performed in such manner that the cabinet is symmetrically configured to support one or more of the articulated boom arms within any of one or more corner structures of the cabinet and to accommodate the one or more racks configured to house electrical equipment therein to be installed within the one or more bays from either side of the cabinet structure.

* * * * *